US006351718B1

(12) United States Patent
Shimazu et al.

(10) Patent No.: US 6,351,718 B1
(45) Date of Patent: Feb. 26, 2002

(54) CURRENT CONTROL APPARATUS

(75) Inventors: Mitsuhiro Shimazu, Hiratsuka; Shuuki Akushichi, Sagamihara, both of (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/230,064

(22) PCT Filed: Jul. 15, 1997

(86) PCT No.: PCT/JP97/02451

§ 371 Date: Jan. 19, 1999

§ 102(e) Date: Jan. 19, 1999

(87) PCT Pub. No.: WO98/03901

PCT Pub. Date: Jan. 29, 1998

(30) Foreign Application Priority Data

Jul. 19, 1996 (JP) ............................................ 8-190902

(51) Int. Cl.$^{7}$ ................................................ G01R 35/04

(52) U.S. Cl. .......................... 702/107; 702/64; 323/283

(58) Field of Search ........................... 702/107, 57, 64; 361/64, 154, 160, 478; 123/480, 491; 323/283, 286, 287

(56) References Cited

U.S. PATENT DOCUMENTS 5,191,504 A * 3/1993 Narisawa ................... 361/186

* cited by examiner

*Primary Examiner*—Kamini Shah
(74) *Attorney, Agent, or Firm*—Diller, Ramik & Wight

(57) ABSTRACT

A current control apparatus capable of accurately and stably controlling a current which is supplied to an object of control such as a coil of a solenoid even when a control target value varies greatly at a predetermined time interval. In this apparatus, a value (y3) of a current passing through the object of control (33) is detected, and the detected current value (y3) is output at a predetermined time intervals. On the basis of a preceding corrected current value (y4old) and a presently outputted current value (y3), a presently corrected current value (y4) is computed so that this value comes to be intermediate between the preceding corrected current value (y4old) and presently outputted current value (y3), and the resultant current value is output. On the basis of a precedingly corrected duty (d3old) and a presently outputted duty (d1), a presently corrected duty (d3) is computed so that the presently corrected duty (d3) has a value intermediate between those of the precedingly corrected duty (d3old) and the presently outputted duty (d1). On the basis of a target current value (x1) to be input, the outputted corrected current value (y4) and the outputted corrected duty (3d), the duty (d1) is computed, and the result is outputted.

4 Claims, 9 Drawing Sheets

CURRENT CONTROL APPARATUS

TECHNICAL FIELD

The present invention relates to a current control apparatus for controlling the magnitude of a current applied to an object of control, and more particularly to a current control apparatus which is used for controlling an actuator that produces a force corresponding to the magnitude of the current applied.

BACKGROUND ART

Electromagnetic proportional valves are used to control the flow rate of pressured oil fed to hydraulic actuators in hydraulic circuits of construction machines and the like. The degree to which such electromagnetic proportional valves are open is virtually proportional to the magnitude of the current applied from a controller to a solenoid attached to the electromagnetic proportional valve. The pressured oil is thus fed to the hydraulic actuator at a flow rate corresponding to the degree to which the valve is open.

In this case, the excitation current actually flowing through the solenoid coil is detected, and the controller controls the current applied to the solenoid so as to obtain a target current value, using the detected current value as the amount of the feedback.

That is, the controller computes at a prescribed time interval a duty corresponding to the target current value that is input at the prescribed time interval, and generates a pulse signal having this duty, which are applied to a driving transistor. When the driving transistor is actuated according to the pulse signal input, current is applied to the solenoid coil, resulting in that the aforementioned target current value is obtained.

However, in actual operations, as a period of applied electricity becomes longer and the temperature of oil, etc. is increased, the temperature of the solenoid coil becomes higher, and the direct current resistance of the coil, etc. is increased accordingly, which prevents current corresponding to the target current value from being applied to the coil and results in lower control precision.

In an effort to prevent the loss of precise control caused by such increases in the coil temperature, Japanese Patent Publication 62-59444 discloses technology that a current is allowed to flow through the solenoid at a constant level which does not trigger the hydraulic actuator when the operating lever is returned to the neutral position in controllers designed to provide the solenoid with a control target value (target current value) in response to the operation of the operating lever the correction coefficient is determined based on the value of the duty at this time and the filtered average detected current value, and the value of the duty is corrected using this correction coefficient.

Although there are no problems when the operating lever is in a neutral zone in the technology described in this patent publication, control errors are produced, even when the duty is corrected, in cases where the operating lever is moved from the neutral zone to full operation.

In the device described in Japanese Patent Publication 7-66299, the excitation current flowing through the solenoid coil is integrated by integration means in synchronization with a PWM pulse signal, and the duty is corrected on the basis of the control target value and the integrated value output from the integration means. This allows errors in control to be avoided when the operating lever is moved from the neutral zone to full operation in order to increase the excitation current to the coil.

In the devices described above, it is assumed that the control target value (target current value) is input to the controller in response to operation of the operating lever, and the control target value is not expected to fluctuate greatly.

However, in cases where the control target value input to the controller has been produced in response to a signal indicating the engine rpm, the considerable fluctuation in the engine rpm results in considerable fluctuation in the control target value at a prescribed time interval.

Such considerable fluctuation in the control target value at a prescribed time interval cannot be dealt with by the technology described in the aforementioned Japanese Patent Publication 62-59444, and control errors are still produced.

Further, when the technology described in the aforementioned Japanese Patent Publication 7-66299 is applied to deal with the fluctuation, the realization of the technology is extremely difficult and control instability is incurred.

That is, the excitation current to the coil is integrated according to PWM pulse cycles in the device described above, resulting in the need for A/D conversion at high speed sampling within a PWM pulse cycle for high-precision integration of the excitation current. This requires a high-speed, high-precision A/D converter, which is extremely difficult to realize.

The control current also tends to be unstable for the following reasons.

1) As it is difficult to achieve the feedback of the integration within every two cycle, it is likely to generate lag and result in instability.

2) In the case of changing the control current value dictated on the basis of the correction coefficient that is to be determined, the correction coefficient is either too great or too little because the actual current cannot be immediately adjusted due to the inductance of the solenoid. This is produced by delays of 1 cycle or more for the same reason as in 1), again tending to result in instability.

As described above, a problem in the prior art is that current applied to the object of control such as a solenoid coil cannot be controlled with high precision in a stable manner in cases involving considerable fluctuation in the control target value at a prescribed time interval.

The present invention is intended to remedy such a drawback.

DISCLOSURE OF THE INVENTION

The main invention of the present invention is a current control apparatus having duty computing means for computing and outputting at a prescribed time interval a duty corresponding to a target current value input at the prescribed time interval, pulse signal generating means for generating a pulse signal having the duty output from the duty computing means, and an object of control to which electricity is supplied when the object is driven by the pulse signal generated by the pulse signal generating means, the current control apparatus comprising current value detecting means for detecting a current value applied to the object of control and for outputting the detected current value at a prescribed time interval; corrected current value computing means for computing and outputting at a prescribed time interval a present corrected current value, based on a preceding corrected current value and the current value presently output from the current value detecting means, so that the present corrected current value has a value intermediate between the preceding corrected current value and the current value presently output from the current value detecting means; and corrected duty computing means for computing and outputting at a prescribed time interval the present corrected duty, based on the preceding corrected duty and the duty presently output from the duty computing means, so that the present corrected duty has a value intermediate between the preceding corrected duty and the duty presently output from the duty computing means, wherein the duty computing means computes and outputs the duty based on the input target current value, the corrected current value output from the corrected current value computing means and the corrected duty output from the corrected duty computing means.

Because the duty computing means thus computes and outputs the duty based on the input target current value, the corrected current value output from the corrected current value computing means, and the corrected duty output from the corrected duty computing means, current coinciding with the target current value can flow through the object of control and control precision can be dramatically improved, despite the resistance of the control object and the changes in the voltage or the like from the power source applied thereto.

Further, the present corrected current value used to compute the duty output from the duty computing means is also computed by the corrected current value computing means at prescribed time interval based on the preceding corrected current value and the current value presently output from the current value detecting means, so that the present corrected current value is midway between the preceding corrected current value and the current value presently output from the current value detecting means, and the present corrected duty used to compute the duty output from the duty computing means is also computed by the corrected duty computing means at prescribed time interval based on the preceding corrected duty and the duty presently output from the duty computing means, so that the present corrected duty is midway between the preceding corrected duty and the duty presently output from the duty computing means. Therefore, the value of the duty with good response and follow-up performance can be computed and output, and control stability can be dramatically improved, despite considerable fluctuation in the target current values at a prescribed time interval.

BEST MODE FOR CARRYING OUT THE INVENTION

Embodiments of the current control apparatus according to the present invention are described below with reference to the accompanying drawings.

Figure 2:
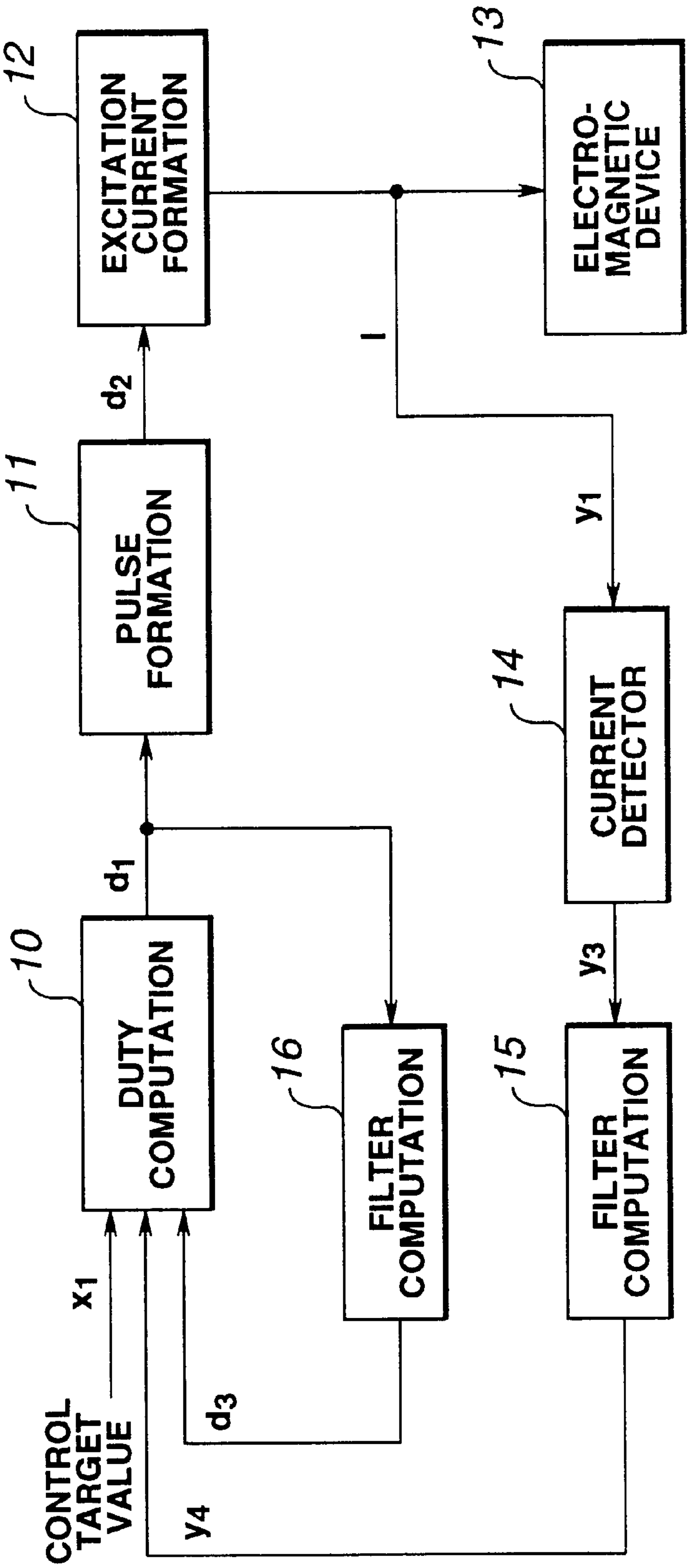
FIG. 2 is a block diagram illustrating the embodiment of the current control apparatus according to the present invention.

FIG. 2 is a block diagram of the device in an embodiment, where the current control apparatus comprises a duty computing component 10 whereby the duty (duty factor) d1 corresponding to a control target value (target current value) x1 input at a constant cycle t1 is computed and output at the constant cycle t1 based on the corrected current value y4 and corrected duty d3 described below; pulse signal generating component 11 for generating a PWM pulse signal d2 corresponding to the duty d1 output from the duty computing component 10; an excitation current forming component 12 for producing an excitation current I corresponding to the pulse signal d2 generated by the pulse signal forming component 11; an electromagnetic device 13 whereby the excitation current I produced by the excitation current forming component 12 is applied to the coil of a proportional solenoid; a current detecting component 14 whereby the excitation current I flowing through the coil of the proportional solenoid of the electromagnetic device 13 is detected as an analog signal y1, which is converted to a digital signal y3 at a constant cycle t2 and is then output; a filter computing component 15 whereby a filter computing process described below is performed at a constant cycle t3 for the current value signal y3 output from the current detecting component 14, and the filtered corrected current value y4 is output to the duty computing component 10; and a filter computing component 16 whereby a filter computing process described below is performed at the constant cycle t3 for the duty d1 output from the aforementioned duty corrected component 10, and the filtered corrected duty d3 is output to the aforementioned duty computing component 10.

Figure 1:
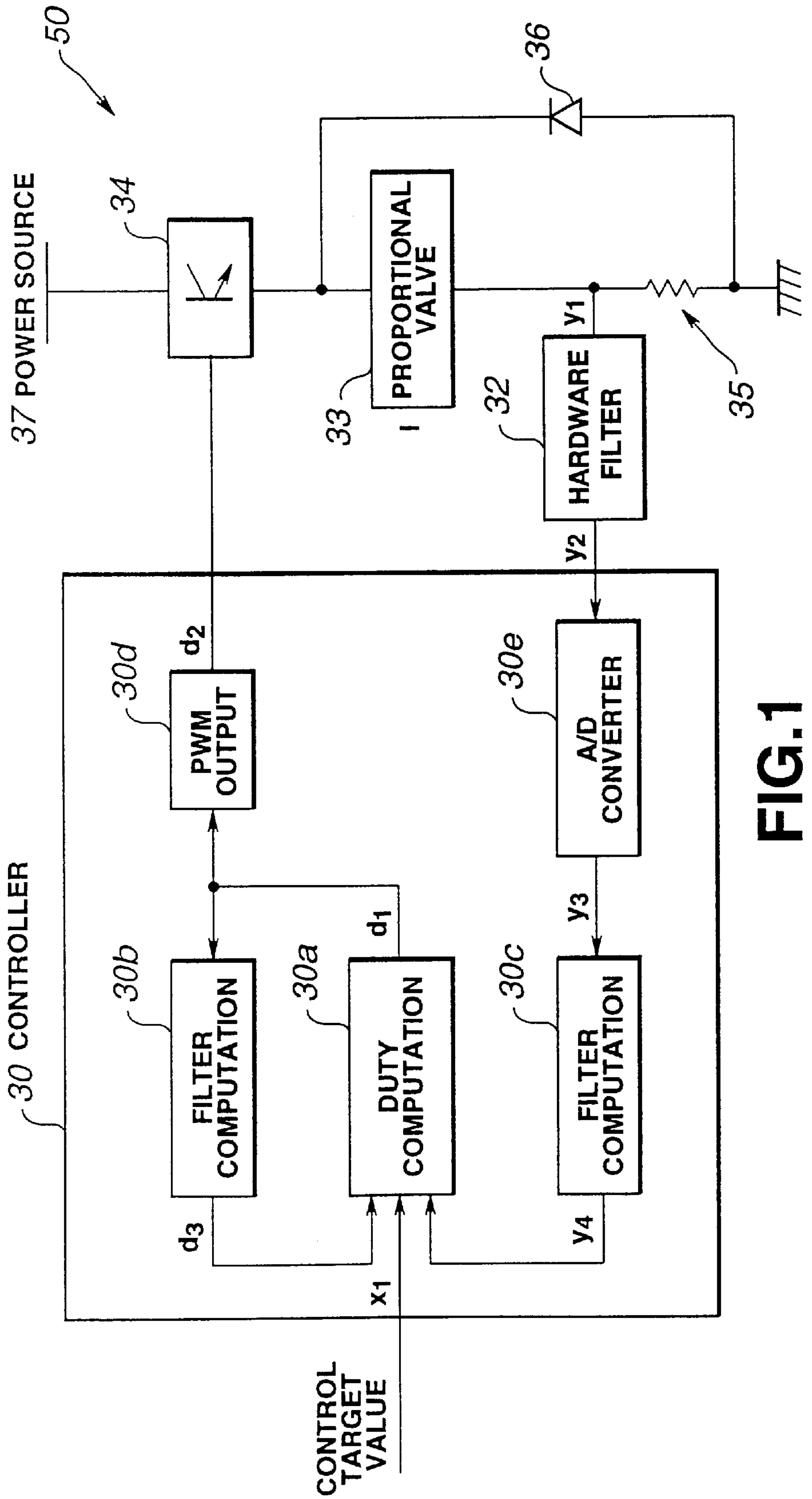
FIG. 1 is a block diagram illustrating an embodiment of the current control apparatus according to the present invention, wherein the controller is constituted by a microprocessor, and an electromagnetic device is constituted by an electromagnetic proportional valve.

FIG. 1 illustrates the block diagram of FIG. 2 in greater detail, wherein an electromagnetic proportional valve 33 is employed as the electromagnetic device 13.

The current control apparatus is constituted by a controller 30 which comprises a microprocessor or the like for inputting a control target value x1 and outputting a PWM pulse signal d2, and a drive component 50 which is operated to adjust the degree to which the proportional electromagnetic valve 33 is open, according to pulse signals d2 input from the controller 30.

The controller 30 comprises a duty computing component 30*a* which corresponds to the duty computing component 10 of FIG. 2, a PWM output component 30*d* which corresponds to the pulse signal forming component 11 of FIG. 2, an A/D converter 30*e* constituting the current detecting component 14 of FIG. 2, a filter computing component 30*c* which corresponds to the filter computing component 15 of FIG. 2, and a filter computing component 30*b* which corresponds to the filter computing component 16 of FIG. 2.

The drive component 50 comprises a drive circuit 34 which corresponds to the excitation current forming component 12 of FIG. 2, a power source 37, a flywheel diode 36, a proportional electromagnetic valve 33 which corresponds to the electromagnetic device 13 of FIG. 2, a current detecting resistor 35 constituting the current detecting component 14 of FIG. 2, and a hardware filter 32.

In the first stage of the controller 30, the control target value (target current value flowing through the proportional electromagnetic valve 33) is produced in response to a signal or the like indicating the engine rpm, the current is converted to the target current value x1 which is to flow through the solenoid coil of the proportional electromagnetic valve 33, and is input to the controller 30.

A PWM pulse signal d2 is output from the PWM output component 30*d* of the controller 30 and is applied to the drive circuit 34 of the drive component 50.

The drive circuit 34 primarily comprises a transistor, which is actuated in response to a pulse signal d2 applied to the transistor base so that a prescribed voltage is applied via the power source 37 to the solenoid coil of the proportional electromagnetic valve 33 to pass the excitation electromagnetic current I.

A battery may be used as the power source 37 here, and can be charged by an alternator or the like.

Figure 3:
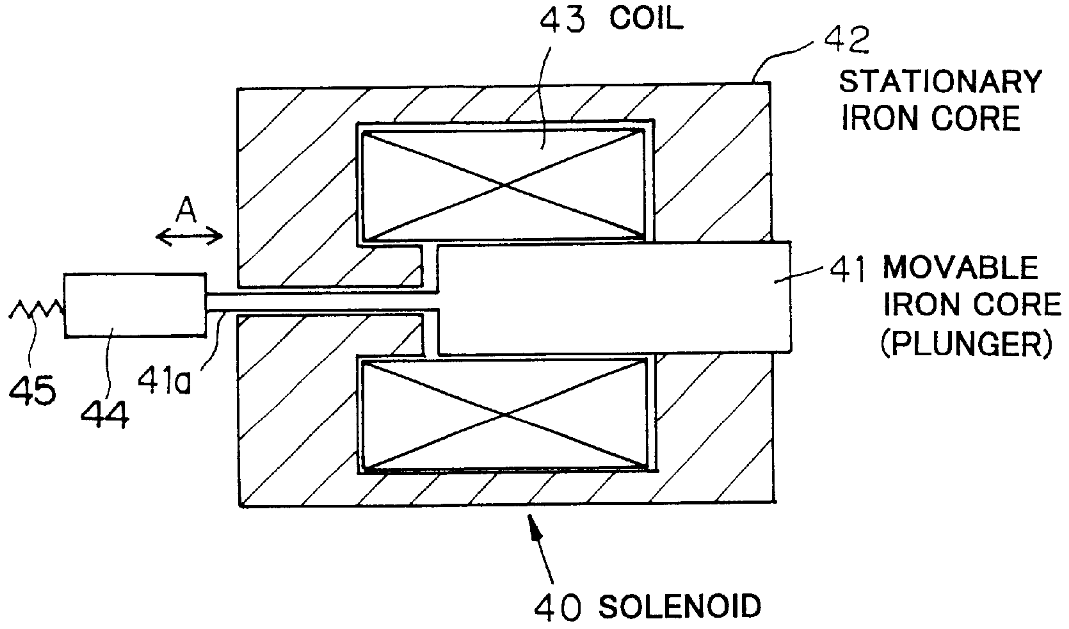
FIG. 3 is a sectional view illustrating the structure of the solenoid for the proportional valve illustrated in FIG. 1.

FIG. 3 is a sectional view of the solenoid 40 which constitutes the proportional electromagnetic valve 33, and comprises a plunger 41 which is a moveable iron core, a stationary iron core 42, and a coil 43. Energy is applied to the plunger 41 in response to the current value I flowing through the coil 43, and the plunger 41 is moved to a position at which this energy and the spring energy of a spring 45 opposing the plunger 41 are in balance. A spool valve 44 of the valve is connected to the tip 41*a* of the plunger 41, and the spool valve 44 is moved according to the positional changes A of the aforementioned plunger 41, thereby adjusting the degree to which the valve is open.

The current value I flowing through the aforementioned coil 43 is detected by the detecting resistor 35 in the form of voltage y1 applied to both ends of the resistor 35, and this signal y1 is applied to the hardware filter 32.

The hardware filter 32 is a low pass filter having cut-off frequency characteristics sufficiently lower than the carrier frequency of the PWM pulse, and the signal y2 passing through the hardware filter 32 is applied to the A/D converter 30*e* where it is converted to a digital signal y3.

This results in the elimination of areasing caused by sampling and the carrier when the excitation current is detected by the detecting resistor 35, allowing the A/D converter 30*e* to detect the excitation current with high precision.

FIGS. 11(*a*) through 11(*g*) give an example of the signal at each component in FIG. 1.

The details of the computing process performed by the duty computing component 30*a*, filter computing component 30*b*, and filter computing component 30*c* of the controller 30 are described below.

Figure 4:
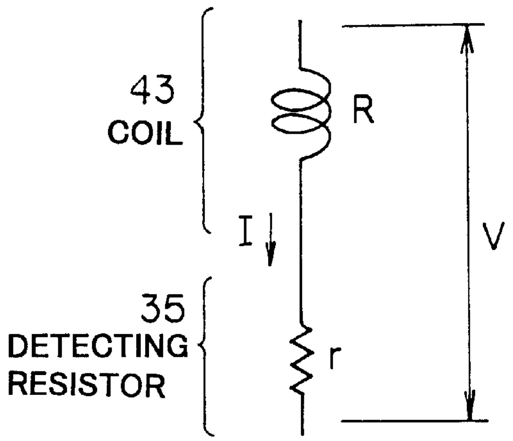
FIG. 4 is an electrical circuit diagram illustrating the relationship between current and voltage applied to a resistor and the proportional electromagnetic valve illustrated in FIG. 1.

FIG. 4 illustrates the relation between current and voltage applied to the detecting resistor 35 and the coil 43 of the solenoid 40 in the proportional electromagnetic valve 33.

As shown in the FIG. 4, R is the resistance of the coil 43, r is the resistance of the detecting resistor 35, I is the current value of the excitation current flowing through the coil 43, and V is the voltage applied to both ends of the detecting resistor 35 and the coil 43.

The relation represented by the following equation 1 is established between the current value I, voltage V, and pulse signal d2, that is, the proportion of time (duty) d2 for which the signal is on relative to the time of one pulse cycle.

$$I=d2\cdot V/(R+r) \quad (1)$$

The relation represented by the following Equation (2) is meanwhile established between the resistance r, the aforementioned excitation current I, and the voltage v at both ends of the detecting resistor 35, that is, the voltage v relative to the detected current value y1.

$$v=I\cdot r \quad (2)$$

Equation (2) is substituted for Equation (1), giving Equation (3).

$$v=d2\cdot(V/(R+r))\cdot r \quad (3)$$

Here, assuming the voltage V and resistance values R and r are constant, the detected current value y1 (voltage v) of the detecting resistor 35 is determined only by the duty d2.

In this case, the duty d1 (d2) showing the theoretical current value is coincident with y1 showing the measured current value, making it unnecessary to correct the measured current value so that it coincides with the theoretical current value. That is, there is no need to compute d1 by the correction operation described below using the duty computing component 30*a* based on the corrected duty d3 which corresponds to duty d1 and the corrected current value y4 which corresponds to the current value y1.

However, the voltage V in Equation (3) fluctuates because of variation in the charging voltage of the power source 37 and the like due to individual differences between alternators. The resistance R also fluctuates according to changes in temperature.

The detected current value y1 (voltage v) of the detecting resistor 35 is thus never determined by the duty d2 alone, and the theoretical and measured current values do not actually coincide with each other. The corrected computation described below is thus needed when determining the d1 using the duty computing component 30*a* in order to coincide the measured current value with the theoretical current value.

Figure 5:
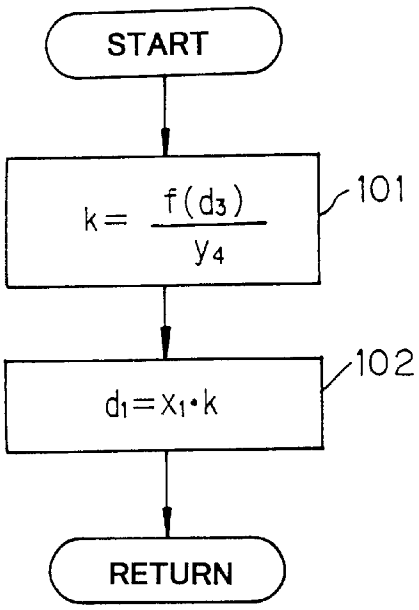
FIG. 5 is a flowchart illustrating the procedure performed by the duty computing component illustrated in FIG. 1.

That is, as shown in FIG. 5, the correction coefficient k is determined at the duty computing component 30*a*, which is as follows (step 101):

$$k=f(d3)/y4 \quad (4)$$

and the corrected duty d1 which corresponds to the control target value x1 is computed on the basis of the correction coefficient k, which is as follows (step 102).

$$d1=x1\cdot k \quad (5)$$

In Equation (4), f(d3) is the theoretical current value obtained from the corrected duty d3, and the corrected current value y4 is the measured current value.

As indicated in Equation (4), k=1 if the theoretical current value f(d3) and the measured current value y4 are equivalent. In this case, the control target value x1 in Equation (5) may be considered the duty d1 as such, and no correction is needed.

Further, in Equation (4), k>1 if the measured current value y4 is lower than the theoretical current value f(d3). In this case, correction computation is carried out to increase the control target value x1 in Equation (5) to obtain the duty d1.

Also, in Equation (4), k<1 if the measured current value y4 is greater than the theoretical current value f(d3). In this case, correction computation is carried out to lower the control target value x1 in Equation (5) to obtain the duty d1.

Figure 12:
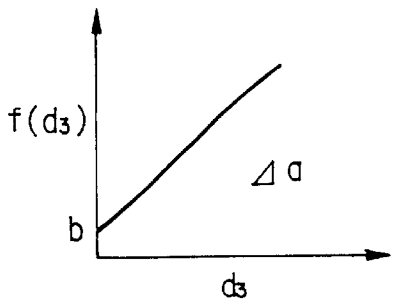
FIG. 12 is a graph illustrating the relation between actually measured current value and theoretical current value.

FIG. 12 gives an example of the relation between the corrected duty d3 and theoretical current value f(d3). In this case, the theoretical current value is:

$$f(d3)=a\cdot d3+b \qquad (6)$$

where a and b are constants greater than 0, and d3 and f(d3) are proportionally related to each other.

Figure 13:
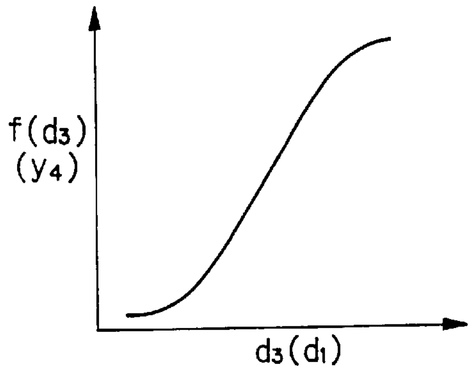
FIG. 13 is a graph illustrating the relation between actually measured current value and theoretical current value.

Actually, however, as shown in FIG. 13, d3 and f(d3) are not proportional when d3 is close to 0 or is close to its maximum value.

That is, FIG. 13 shows the relation between the theoretical current value d1 and the measured current value y4 when the output for the duty computing component 30*a* in the circuit in FIG. 1 is input as such as the control target value x1 to the duty computing component 30*a*.

Here, as apparent from Equation (1), the relation between the duty d1 and the average current I0 of the current flowing through the coil 43 of the solenoid 40 in FIG. 3 is as follows.

$$I0=d1\cdot V/(R+r) \qquad (7)$$

In actuality, however, Equation (7) is the relation when the solenoid 40 is driven under ideal conditions, and since voltage loss occurs in the diode 36 under actual conditions, the relation (proportional relation) in the aforementioned Equation (7) is not established, but the relation becomes in a nonlinear relation (see FIG. 13).

The position of the plunger 41 of the solenoid 40 changes according to the current value I flowing through the coil 4, as described above. The inductance L of the solenoid 40 changes with the changes in the plunger position. That is, the relation is established between the inductance L and the gap as in the following equation:

$$L\ 1/g \qquad (8)$$

where g is the gap between the plunger 41 and stationary iron core 42.

The proportional relation I0 d1 in the aforementioned Equation (7) thus is not obtained as a result of these nonlinear components, and the relation of the nonlinear components in FIG. 13 is determined by the basic design values of the solenoid 40. Thus, the function f in FIG. 13 is predetermined according to the basic design values of the solenoid 40, and a theoretical current value f(d3) should be determined from the function f. Of course, if the nonlinear components can be approximated as linear ones, a theoretical current value f(d3) can be determined from the function f (see Equation (6)) for the proportional relation shown in FIG. 12.

The computation for determining the correction coefficient k is not limited to the computation represented in the aforementioned Equation (4). It is possible to use any correction coefficient allowing the actual measured current value to be coincided with the theoretical current value.

When the control target value x1 becomes zero, the duty d1 becomes zero based on the aforementioned Equation (5) (d1=x1·k). Since the excitation current y1 is also zero at this time, the corrected current value y4 computed by the filter computing component 30*c* becomes also zero ultimately. When the corrected current value y4 is substituted as such into the aforementioned Equation (4) (k=f(d3)/y4) to determine the correction coefficient k, the correction coefficient k is indefinite, and the duty d1 obtained on the basis of the correction coefficient k shows abnormal values.

Thus, when the control target value x1 is zero, Equation (4) is not computed as such, but the value for the correction coefficient k is recorded and stored, and the value of the correction coefficient k recorded and stored immediately before the control target value x1 became zero is used to compute Equation (5), so as to determine the duty d1. A duty d1 showing abnormal values can thus be avoided.

A limiter may be applied to the computed results of Equation (5) so as to avoid the output of abnormal duty d1 values.

Examples of methods for applying a limiter include:

a) suitably presetting the maximum and minimum values for the computed results d1 of Equation (5); and b) determining D % value relative to the computed results d1, that is, (D/100)·d1 when the correction coefficient k is 1 in Equation (5), and establishing −(D/100)·d1 as the minimum value and (D/100)·d1 as the maximum value.

In the initial stages immediately following the turning on of the power source or the like, the values for d3 and y4 output from filter computing components 30*b* and 30*c* are unstable, and the duty d1 determined on that unstable basis sometimes shows abnormal values. Thus, in the initial stages immediately after the power source is turned on, the correction coefficient k is uniformly established as 1, and the correction coefficient k is determined on the basis of the aforementioned Equation (4) after the initial stage has elapsed (after a fixed period of time has elapsed).

Figure 6:
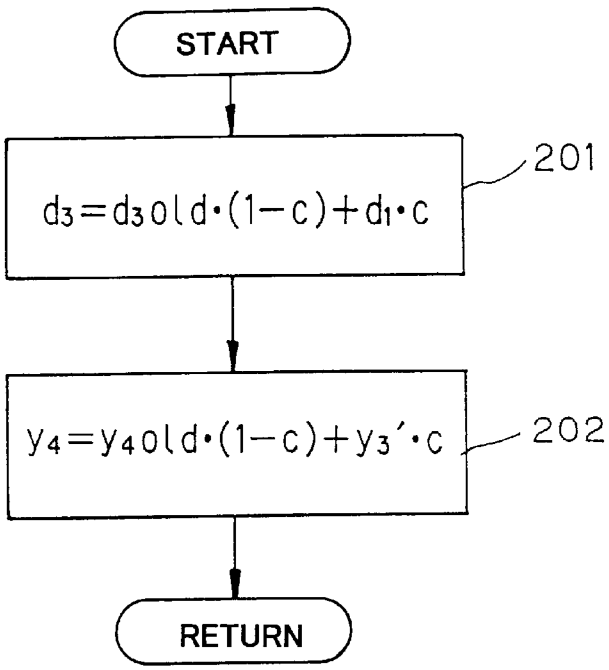
FIG. 6 is a flowchart illustrating the procedure performed by the filter computing component illustrated in FIG. 1.
Figure 8:
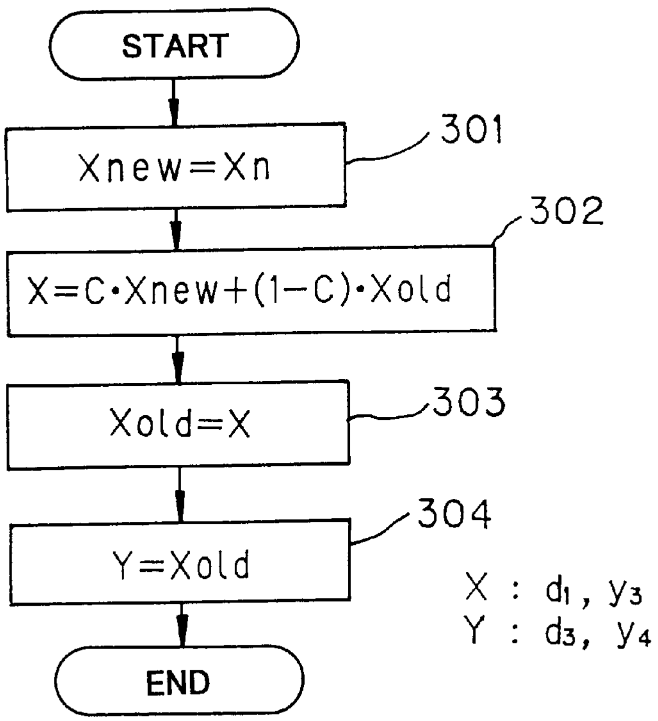
FIG. 8 is a flowchart illustrating the procedure performed by the filter computing function illustrated in FIG. 1.

FIGS. 6 and 8 show the process for determining the corrected duty d3 and corrected current value y4 necessary for determining the correction coefficient k in step 101 in FIG. 5. This computing process is performed by filter computing components 30*b* and 30*c*.

Figure 7:
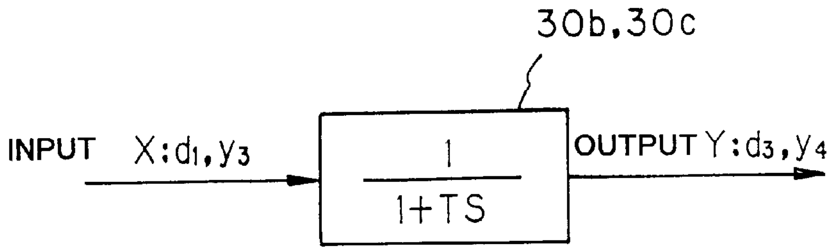
FIG. 7 illustrates the transfer function of the filter computing component illustrated in FIG. 1.

That is, the filter computing components 30*b* and 30*c* perform filtering using primary low-pass filters as the filters, and output d3 and y4 based on d1 and y3. Expressed as a transfer function, where X (d1, y3) is the input, and Y (d3, y4) is the output, the transfer function with primary delay is represented by the following equation, as shown in FIG. 7:

$$Y/X=1/(1+Ts) \qquad (9)$$

where T is the filter time constant.

The filters are not limited to primary low-pass filters, but may also be higher-order low-pass filters.

Equation 9 is performed in the computation process shown in FIG. 8.

The computing process shown in FIG. 8 is started every sampling time ΔT (cycle t3 shown in FIGS. 11(*f*) and 11(*g*)) and is repeatedly performed, and corrected value Y is obtained by correcting the input X.

In the computing process, first, the new nth data Xn is sampled, and Xn serves as the content of Xnew (step 301).

Then, based on Xnew presently obtained in step 301 and the previously computed corrected value Xold, the present corrected value X is determined as follows:

$$X=c\cdot Xnew+(1-c)\cdot Xold \qquad (10)$$

where c is the filter coefficient, $0<c\leqq 1$.

Here, the relation between the filter time constant T, the sampling time ΔT and the filter coefficient c is expressed as follows (step 302).

$$c=T/(T+\Delta T) \quad (11)$$

The corrected value X presently obtained in step 302 serves as the contents of Xold (step 303), and Xold is output as corrected value Y by the filter computing components 30*b* and 30*c* (step 304).

The corrected duty d3 is computed from the following equation:

$$d3=c\cdot d1+(1-c)\cdot d3old \quad (12)$$

which is obtained from Equation (10) by substituting d3 for X in Equation (10), d1 for Xnew and d3old for Xold. The result is output from the filter computing component 30*b*.

In other words, a present corrected duty d3 is computed based on the preceding corrected duty d3old and the duty d1 presently output from the duty computing component 30*a* such that the present corrected duty d3 has a value intermediate between the preceding corrected duty d3old and the duty d1 presently output from the duty computing component 30*a*. The present corrected duty d3 is then output from the filter computing component 30*b*. The "value intermediate between" includes the value of the preceding corrected duty d3old and the value of the duty d1 presently output from the duty computing component 30*a*. In other words, it means any value between d3old and d1 (step 201).

The corrected current value y4 is then computed from the following equation:

$$y4=c\cdot y'3+(1-c)\cdot y4old \quad (13)$$

which is obtained by substituting y4 for X in the aforementioned Equation (10), y'3 (this is obtained on the basis of y3) for Xnew and y4old for Xold. The result is output from the filter computing component 30*c*.

In other words, a suitable present corrected current value y4 is computed on the basis of the preceding corrected current value y4old and the average current value y'3 obtained on the basis of the current value y3 presently output from the A/D converter 30*e* such that the present corrected current value y4 has a value intermediate between the preceding corrected current value y4old and the average current value y'3 obtained on the basis of the current value y3 output from the A/D converter 30*e,* and it is then output from the filter computing component 30*c*. The "value intermediate between" includes the value of the preceding corrected current value y4old and the average current value y'3 obtained on the basis of the current value y3 presently output from the A/D converter 30*e*. In other words, it means any value between y4old and y'3 (step 202).

The process in FIG. 6 is performed every sampling time ΔT, but the process in FIG. 5 does not have to be synchronized with the sampling time ΔT.

Figure 9:
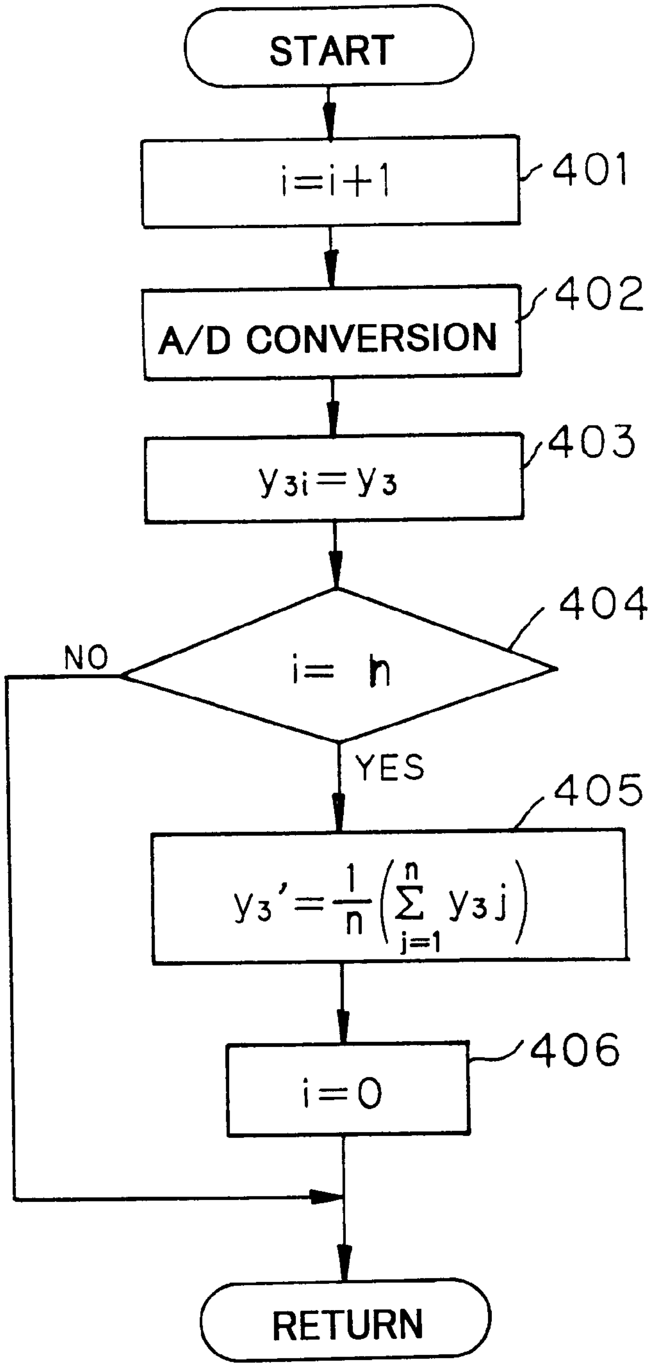
FIG. 9 is a flowchart illustrating the procedure performed by the filter computing component illustrated in FIG. 1.

FIG. 9 is a flowchart illustrating the procedure for determining the average current value y'3 in the aforementioned Equation (13).

As shown in this figure, the count value i of the counter (initial value is 0) is incremented by +1 (step 401), and A/D conversion is performed by the A/D converter 30*e* to obtain a digital signal y3 (step 402).

Here, an array of n registers capable of storing n (up to before n times) digital data y3 is prepared, and the content of the ith register y3i becomes the digital data y3 obtained at the count value i (step 403).

It is then determined whether or not the present count value i has reached n (step 404).

If it is determined that the count value i has not reached n, the procedure moves to step 401, and the same process is repeated, but if it is determined that the count value i has reached n, the average value y'3 of the n (up to before n times) digital data y3i (i=1 to n) stored in the registers is determined (step 405).

$$y'3=(1/n)\cdot\sum_{j=1}^{n} y3^{j} \quad (14)$$

The value i is then reset to 0 (step 406), and the procedure moves again to step 401.

The average current value y'3 for the past n times including the presently obtained current value y3 is computed, and it is substituted into Equation (13) to compute the corrected current value y4.

The process for determining the average current value y'3 in FIG. 9 is performed at a more rapid interval than the interval in FIG. 6.

In Equation (13), the presently obtained current value y3 may be used as it is instead of the average current value y'3.

As described above, the corrected current value y4 and the corrected duty d3 necessary for determining the correction coefficient k are determined by performing what is referred to as filter computation using the filter computing components 30*b* and 30*c*.

In this case, instead of using the duty d1 and current value y3 as they are, the filter computation may be performed by using the duty d1 and current value y3 on which integration process is performed. The integrated value should be reset each time the filter computation is carried out.

Figure 10:
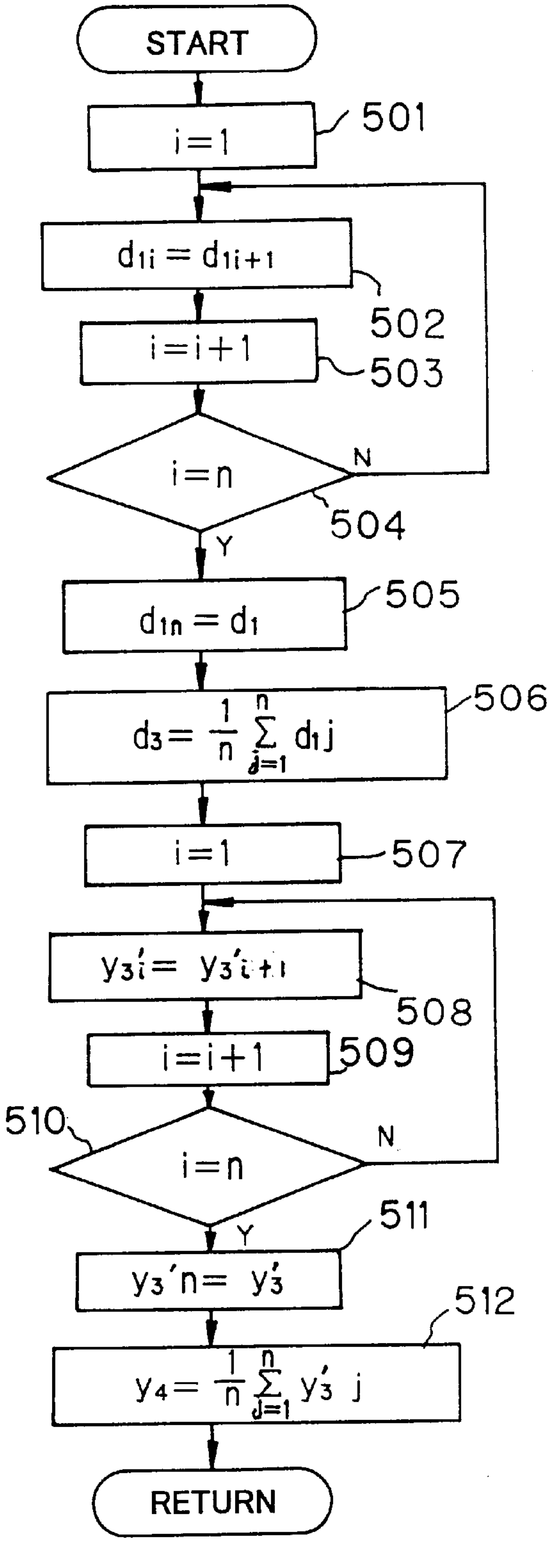
FIG. 10 is a flowchart illustrating the procedure performed by the filter computing component illustrated in FIG. 1.
Figure 11A:
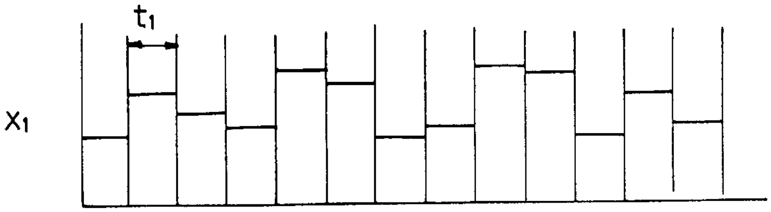
FIGS. 11(*a*) through 11(*g*) are timing charts for the signal at each part in FIG. 1.
Figure 11B:
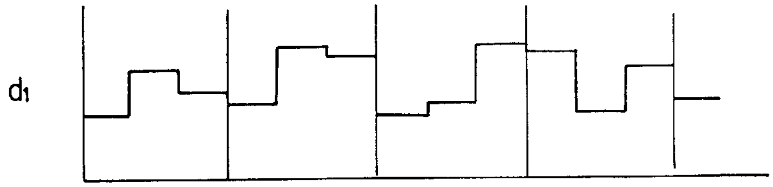
Figure 11C:
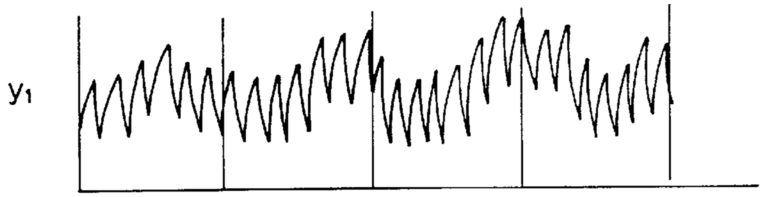
Figure 11D:
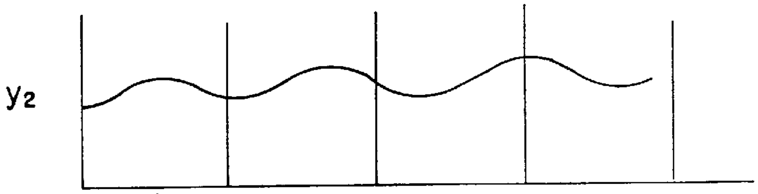
Figure 11E:
Figure 11F:
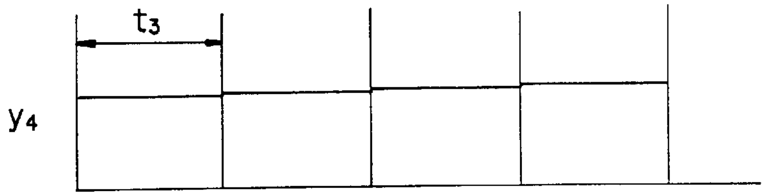
Figure 11G:
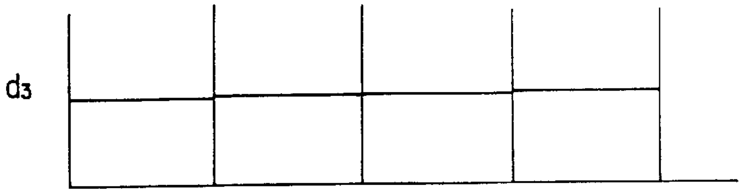

As an alternative to the aforementioned filter computation, the sectional average computation process shown in FIG. 10 may be preformed, so as to determine the corrected duty d3 and the corrected current value y4 necessary for determining the correction coefficient k.

In this case, the process in FIG. 10 is performed instead of performing the processes in FIGS. 6 and 8.

Referring to FIG. 10, i is first initialized to 1 (step 501).

Figure 14:
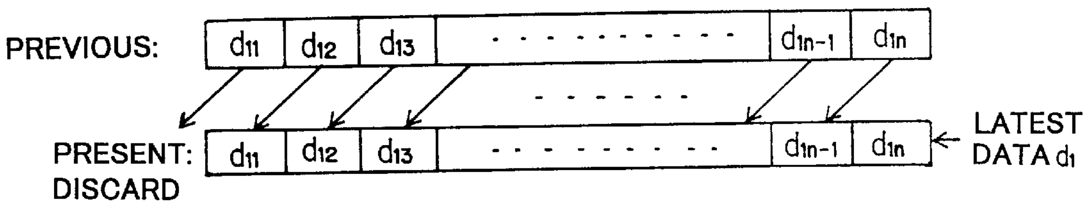
FIG. 14 illustrates the content stored in a register array, which is used to describe the sectional average computing process in FIG. 10.

Here, as shown in FIG. 14, a register array {d1i, d12, . . . , d1n} capable of storing n (up to before n times) digital data d1 in n registers is prepared, where d1i indicates the value of d1 stored in the ith register of the register array.

A process is performed in which the value of d1 stored in the i+1th register of the previous register array is stored anew in the ith register of the present register array (step 502).

Then, i is incremented by +1 (step 503), and the same process is repeated (step 502 to 503) unless i reaches n (No in step 504).

When i reaches n, a process is performed in which the duty d1 presently output from the duty computing component 30*a* is stored in the nth register of the present register array (step 505).

The arrows in FIG. 14 show the movement of the register array storage locations described above. That is, the data for d1 up to before n times is stored and held each time in the register array, and the stored contents are renewed each time.

The average value for these sections (i=1 to n) is then computed in the following manner based on the stored contents d1i (i=1 to n) of the present register array thus obtained, and the average value by section is used as the corrected duty d3.

$$d3=(1/n)\cdot\sum_{j=1}^{n} d1j \qquad (15)$$

That is, the average value of the data for the duty d1 up to before n times is used as the corrected duty d3 each time and is then output (step 506).

The corrected duty current value y4 is determined in the same manner as the corrected duty d3.

That is, i is initialized to 1 (step 507), and a process is performed in which the value for y'3 stored in the i+1th register of the previous register array is stored anew in the ith register of the present register array (step 508).

The value for i is then incremented by +1 (step 509), and the same process is repeated (step 508 to 509) unless i reaches n (NO in 510).

When i reaches n, a process in performed in which the average current value y'3 presently obtained as a result of the computation of the average current value in FIG. 9 is stored in the nth register of the present register array (step 511).

The data for y'3 up to before n times is stored and held each time in the register array, and the stored contents are updated each time.

The average value for these sections (i=1 to n) is then computed in the following manner based on the stored contents y'3i (i=1 to n) of the present register array thus obtained, and the average value by section is used as the corrected current value y4.

$$y4=(1/n)\cdot\sum_{j=1}^{n} y'3j \qquad (16)$$

That is, the average value of the data for the average current value y'3 up to before n times is used as the corrected current value y4 each time, and is then output (step 512).

In the foregoing, a case in which the corrected current value y4 and the corrected duty d3 are determined by the filter computation shown in FIG. 6 and a case in which the corrected current value y4 and the corrected duty d3 are determined by the section average computation shown in FIG. 10 are separately described. Alternatively, it is also possible to determine the corrected current value y4 by the filter computation shown in step 202 of FIG. 6, and to determine the corrected duty d3 by the section average computation shown in steps 501 through 506 in FIG. 10. Conversely, it is also possible to determine the corrected current value y4 by the section average computation shown in steps 507 through 512 of FIG. 10, and to determine the corrected duty d3 by the filter computation shown in step 201 in FIG. 6.

FIGS. 11(*a*) through 11(*g*) illustrate timing charts for a signal at each component in FIG. 1.

As shown in FIG. 1(*a*), the control target value x1 is input at each cycle t1. This figure shows that the value of the control target value x1 fluctuates greatly at each cycle t1.

FIG. 11(*b*) shows the duty d1 computed and output from the duty computing component 30*a*. Since the duty d1 is obtained by correcting the input control target value x1 on the basis of the corrected current value y4 and the corrected duty d3, the duty d1 has no response lag to the input x1 shown in FIG. 11(*a*).

FIG. 11(*c*) shows the current y1 (analog signal) detected by the excitation current detecting resistor 35. The figure shows that there is a response lag corresponding to the inductance of the coil 43 of the solenoid 40 with respect to the duty d1 in FIG. 11(*b*).

FIG. 11(*d*) shows the current y2 (analog signal) having been processed by the hardware filter 32. The figure shows that high-pass frequency components have been eliminated.

FIG. 11(*e*) shows the current y3 (digital signal) having been processed by the A/D converter 30*e*. This figure shows that the A/D converter 30*e* converts the analog signal y2 to a digital signal y3 at a cycle t2, and then outputs the digital signal y3.

FIG. 11(*f*) shows the corrected current y4 after the correction process by the filter computing component 30*c*. The filter computing component 30*c* performs the filter computation shown in step 202 of FIG. 6 or the section average computation shown in steps 507 through 512 in FIG. 10 at cycle t3, and then outputs the corrected current value y4. This figure shows that the correction is made so that the fluctuation in the signals y4 shown in FIG. 11(*f*) is extremely smaller compared with the fluctuation in the signals y3 shown in FIG. 11(*e*).

FIG. 11(*g*) shows the corrected duty d3 after the correction process by the filter computing component 30*b*. The filter computing component 30*b* performs the filter computation shown in step 201 of FIG. 6 or the section average computation shown in steps 501 through 506 in FIG. 10 at cycle t3, and then outputs the corrected duty d3 successively. This figure shows that the correction is made so that the fluctuation in the signals d3 shown in FIG. 11(*g*) is extremely smaller compared with the fluctuation in the signals d1 shown in FIG. 11(*b*).

As described in the foregoing, the corrected current value y4 and corrected duty d3 having smaller fluctuations than those in the signals y3 and d1 are obtained (see FIGS. 11(*f*) and (*g*)), and then the duty d1 is determined by correcting the input x1 based on the corrected current value y4 and corrected duty d3. As a result, even if substantial variation occurs in the control target value x1 for every cycle t1 (see FIG. 11(*a*)), it is possible to compute and output a duty value d1 with good response and follow-up performance (see FIG. 11(*b*)), resulting in great improvement in control stability.

What is claimed is:

1. A current control apparatus including duty computing means for computing and outputting at a prescribed time interval a duty corresponding to a target current value input at the prescribed time interval, pulse signal generating means for generating a pulse signal having the duty output from the duty computing means, and an object of control to which electricity is supplied when the object is driven by the pulse signal generated by the pulse signal generating means, the current control apparatus comprising:

current value detecting means for detecting a current value applied to the object of control, and for outputting the detected current value at a prescribed time interval;

corrected current value computing means for computing and outputting at a prescribed time interval a present corrected current value based on a preceding corrected current value and the current value presently output from the current value detecting means, so that the present corrected current value has a value intermediate between the preceding corrected current value and the current value presently output from the current value detecting means; and corrected duty computing means for computing and outputting at a prescribed time interval a present corrected duty based on the preceding corrected duty and the duty presently output from the duty computing means, so that the present corrected duty has a value intermediate between the preceding corrected duty and the duty presently output from the duty computing means, wherein the duty computing means computes and outputs the duty based on the input target current value, the corrected current value output from the corrected current value computing means and the corrected duty output from the corrected duty computing means.

2. A current control apparatus including duty computing means for computing and outputting at a prescribed time interval a duty corresponding to a target current value input at the prescribed time interval, pulse signal generating means for generating a pulse signal having the duty output from the duty computing means, and an object of control to which electricity is supplied when the object is driven by the pulse signal generated by the pulse signal generating means, the current control apparatus comprising:

current value detecting means for detecting a current value applied to the object of control, and for outputting the detected current value at a prescribed time interval;

corrected current value computing means for computing an average of the current value presently output from the current value detecting means and a specified number of previous output current values at a prescribed time interval, and for outputting the result as the corrected current value; and corrected duty computing means for computing an average of the duty presently output from the duty computing means and a specified number of previous output duties at a prescribed time interval, and for outputting the result as the corrected duty, wherein the duty computing means computes and outputs the duty based on the input target current value, the corrected current value output from the corrected current value computing means and the corrected duty output from the corrected duty computing means.

3. A current control apparatus including duty computing means for computing and outputting at a prescribed time interval a duty corresponding to a target current value input at the prescribed time interval, pulse signal generating means for generating a pulse signal having the duty output from the duty computing means, and an object of control to which electricity is supplied when the object is driven by the pulse signal generated by the pulse signal generating means, the current control apparatus comprising:

current value detecting means for detecting a current value applied to the object of control, and for outputting the detected current value at a prescribed time interval;

corrected current value computing means for computing and outputting at a prescribed time interval a present corrected current value based on a preceding corrected current value and the current value presently output from the current value detecting means, so that the present corrected current value has a value intermediate between the preceding corrected current value and the current value presently output from the current value detecting means; and corrected duty computing means for computing an average of the duty presently output from the duty computing means and a specified number of previous output duties at a prescribed time interval, and for outputting the result as the corrected duty, wherein the duty computing means computes and outputs the duty based on the input target current value, the corrected current value output from the corrected current value computing means and the corrected duty output from the corrected duty computing means.

4. A current control apparatus including duty computing means for computing and outputting at a prescribed time interval a duty corresponding to a target current value input at the prescribed time interval, pulse signal generating means for generating a pulse signal having the duty output from the duty computing means, and an object of control to which electricity is supplied when the object is driven by the pulse signal generated by the pulse signal generating means, the current control apparatus comprising:

current value detecting means for detecting a current value applied to the object of control, and for outputting the detected current value at a prescribed time interval;

corrected current value computing means for computing an average of the current value presently output from the current value detecting means and a specified number of previous output current values at a prescribed time interval, and for outputting the result as the corrected current value; and corrected duty computing means for computing and outputting at a prescribed time interval a present corrected duty based on the preceding corrected duty and the duty presently output from the duty computing means, so that the present corrected duty has a value intermediate between the preceding corrected duty and the duty presently output from the duty computing means, wherein the duty computing means computes and outputs the duty based on the input target current value, the corrected current value output from the corrected current value computing means and the corrected duty output from the corrected duty computing means.

* * * * *